United States Patent
Zhu et al.

(10) Patent No.: US 7,212,051 B1
(45) Date of Patent: May 1, 2007

(54) CONTROL SIGNAL GENERATION FOR A LOW JITTER SWITCHED-CAPACITOR FREQUENCY SYNTHESIZER

(75) Inventors: Xiang Zhu, San Jose, CA (US); Ming Qu, San Jose, CA (US); Zhengyu Yuan, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 11/260,097

(22) Filed: Oct. 26, 2005

Related U.S. Application Data

(62) Division of application No. 10/842,345, filed on May 7, 2004, now Pat. No. 7,002,418.

(51) Int. Cl.
*H03L 7/06* (2006.01)
*G01R 25/00* (2006.01)

(52) U.S. Cl. ............................ 327/156; 327/147; 327/7; 327/12

(58) Field of Classification Search .................. None
See application file for complete search history.

(56) References Cited

U.S. PATENT DOCUMENTS

| | | | |
|---|---|---|---|
| 4,751,469 A | 6/1988 | Nakagawa | |
| 5,121,085 A * | 6/1992 | Brown | 331/8 |
| 5,373,255 A | 12/1994 | Bray | |
| 5,495,512 A * | 2/1996 | Kovacs et al. | 375/376 |
| 5,598,118 A | 1/1997 | Kofman | |
| 5,973,536 A | 10/1999 | Maejima | |
| 6,054,903 A * | 4/2000 | Fiedler | 331/17 |
| 6,100,721 A | 8/2000 | Durec | |
| 6,320,424 B1 * | 11/2001 | Kurd et al. | 327/8 |
| 6,320,435 B1 * | 11/2001 | Tanimoto | 327/156 |
| 6,414,541 B1 | 7/2002 | Arvidsson | |
| 6,437,608 B1 | 8/2002 | Miyabe | |
| 6,791,378 B2 | 9/2004 | Rossi | |
| 6,825,730 B1 * | 11/2004 | Sun | 331/16 |
| 7,019,571 B2 * | 3/2006 | Lim | 327/157 |
| 2004/0085105 A1 * | 5/2004 | Mika et al. | 327/157 |
| 2004/0095196 A1 * | 5/2004 | Maxim et al. | 331/17 |
| 2005/0062550 A1 * | 3/2005 | Melanson | 331/17 |

OTHER PUBLICATIONS

Maxim, Adrian. "A Low-Jitter 125-1250 MHz Process-Independent And Ripple-Poleless O.18um CMOS PLL Based On A Sample-Reset Loop Filter,".
IEEE Journal of Solid-State Circuits, vol. 36, No. 11, Nov. 2001.
U.S. Appl. No. 10/841,987, filed May 7, 2004, Zhu.

* cited by examiner

*Primary Examiner*—Tuan T. Lam

(57) ABSTRACT

A phase detector and control signal generator responds to a reference signal and a feedback signal to produce a non-delayed up and down signal. A programmable delay unit delays the non-delayed up and down signal to provide up and down signals for a charge pump. A divider configured to respond to the up and down signals provides a divided clock signal. A non-overlapped clock generator configured to respond to the divided clock signal to provide non-overlapped hold even and hold odd signals for the switched-capacitor ripple-smoothing filter.

9 Claims, 8 Drawing Sheets

_US 7,212,051 B1_

CONTROL SIGNAL GENERATION FOR A LOW JITTER SWITCHED-CAPACITOR FREQUENCY SYNTHESIZER

RELATED APPLICATION DATA

This application is a divisional of application Ser. No. 10/842,345, filed May 7, 2004, now U.S. Pat. No. 7,002,418. This application is also related to application Ser. No. 10/841,987, filed May 7, 2004, the contents of which are hereby incorporated by reference.

TECHNICAL FIELD

The present invention relates generally to phase-locked loops, and more particularly to the control signal generation for a switched-capacitor frequency synthesizer.

BACKGROUND

Phase-locked loops (PLLs) are often used as clock regenerators or frequency synthesizers in digital systems. PLLs have a wide variety of applications in areas such as communication devices and other types of digital electronics. FIG. 1 illustrates a conventional PLL 100. PLL 100 functions to maintain a clock output 110 in phase alignment with a reference clock 120. The clock output is fed back through a loop divider 130 to form feedback signal 105 and compared with the reference clock in a phase detector 140. Based upon this comparison, the phase detector adjust the pulse widths of an up signal and a down signal 145 (denoted as UP/DN) based upon whether the clock output lags or leads in phase with respect to the reference clock. A charge pump 150 receives the up and down signals and changes the capacitively-stored charge in a loop filter 160 accordingly.

FIG. 2 illustrates a simplified view of the functional relationship between the charge pump and the loop filter. The charge pump acts as a current switch to either sink or source a current I from a capacitor C in the loop filter using current sources I1 and I2. Should the up signal be pulsed before the down signal, the current switch couples a terminal S1 to the loop filter so that the current I from source I1 charges the capacitor. As a result, the voltage across this capacitor increases. When the down signal is subsequently pulsed, the current switch decouples from terminal S1 such that the raised voltage is held until the next up/down pulse cycle. As seen in FIG. 1, this raised voltage will then drive a voltage-controlled oscillator 170 to increase the frequency of the clock output to reduce the phase lag that prompted the pulsing of the up signal. Referring again to FIG. 2, should the down signal be pulsed before the up signal, the current switch couples the loop filter to a terminal S2 so that the current I from source I2 is sourced from the capacitor in the loop filter. As a result, the voltage across the capacitor decreases. When the up signal is subsequently pulsed, the current switch decouples from terminal S2 so that the decreased voltage is maintained across the capacitor. Referring back to FIG. 1, this reduced voltage will cause the VCO to reduce the clock output frequency, thereby reducing the phase lead that prompted the pulsing of the down signal. Those of ordinary skill in the art will appreciate the FIG. 2 is a simplified view of the loop filter operation in that a loop filter will actually have two input nodes: a positive input node and a negative input node that are charged in a complementary fashion with respect to a common-mode voltage.

Those of ordinary skill in the art will further appreciate that PLL 100 may be configured for either a single-ended or a differential (double-ended) operation. As illustrated, PLL 100 is shown in a single-ended embodiment. However, a differential embodiment provides greater resistance to noise through its well-known common-mode rejection properties. In a differential operation, the up and down signal would each have a positive and a negative component, wherein the positive and negative components are displaced in a complementary fashion from a common-mode voltage.

Although the preceding PLL operation has had wide application, the up and down signals are inherently "bursty" in that they cannot have a duration longer than the output clock period. The abrupt changes in the up and down signals lead to "ripples" in the control voltage provided by the loop filter, thereby causing jitter in the clock output. Referring now to FIG. 3, an alternative PLL topology known as a sample-reset loop filter 300 is shown that addresses this jitter problem. This alternative PLL topology may also be denoted as a switched-capacitor frequency synthesizer. As discussed with respect to PLL 100, sample-reset loop filter includes a phase detector 140 that compares the phases of a reference clock 120 to a feedback signal 105 to generate the up and down control signals. Similarly, the feedback signal is a divided version of an output clock 110 as provided by a loop divider 130. However, instead of a VCO, a current-controlled oscillator (CCO) 310 responds to a control current 315 to adjust the frequency of the output clock. To produce the control current, a loop filter 320 includes an integration path 330 and a feed-forward path 340. The feed-forward path, which may also be denoted as a switched-capacitor ripple-smoothing filter, filters the charge provided by a charge pump B and the integrating path filters the charge provided by a charge pump A. Charge pumps A and B respond to the pulse widths of the up and down signals to alter a capacitively-stored voltage within each loop filter path as discussed analogously with respect to PLL 100. Each path includes a transconductance stage (not illustrated) that converts the respective voltages to a current. The currents from the paths are then combined to produce the control current 315 that drives the CCO. Because the capacitively-stored voltage in the proportional path 340 must be reset each sampling period with respect to the up and down pulses, a double sampling architecture may be used within the feed-forward path to provide a smoother control current that induces less jitter in the output clock. In addition, the reset circuitry is simplified in a double sampling architecture.

Although a sample-reset loop filter having a double sampling architecture in the switched-capacitor ripple-smoothing filter advantageously reduces output clock jitter, it suffers from a number of disadvantages. In particular, the generation of the control signals for double sampling architecture is cumbersome. Moreover, the control signal timing unnecessarily slows the overall PLL processing speed.

SUMMARY

In accordance with one aspect of the invention, a control signal generator for a switched-capacitor ripple-smoothing filter is provided. The control signal generator includes a phase detector configured to compare the phases of a reference signal and a feedback signal and generate a non-delayed up signal and a non-delayed down signal responsive to the phase comparison; a programmable delay circuit configured to delay the non-delayed up and down signals to provide an up signal and a down signal; a divider configured to respond to the up and down signals to provide a divided clock signal; and a non-overlapped clock generator configured to respond to the divided clock signal to provide non-overlapped hold even and hold odd signals.

In accordance with another aspect of the invention, a method is provided to generate the control signals for a switched-capacitor ripple-smoothing filter. The method includes the acts of: programmably delaying a periodically-pulsed non-delayed up signal and a periodically-pulsed non-delayed down signal to provide a periodically-pulsed up and down signal; asserting a timing signal from the end of each up and down pulse cycle to the end of the subsequent up and down pulse cycle; processing the timing signal to generate a non-overlapped hold even signal, hold odd signal, and processing the timing signal and the non-delayed up and down signals to provide a non-overlapped reset signal.

In accordance with another aspect of the invention, a sample-reset loop filter is provided. The loop filter includes: a first charge pump configured to charge a first pair of input nodes in a complementary fashion responsive to the pulse widths of an up signal and a down signal; a second charge pump configured to charge a second pair of input nodes in a complementary fashion responsive to the pulse widths of the up and down signals; a loop filter having an integration path configured to filter the potentials of the first pair of input nodes to provide an integration current and having a feed-forward path configured to filter the potential of the second pair of input nodes to provide a feed-forward current; and a current-controlled oscillator configured to adjust the frequency of an output signals responsive to the summation of the integration current and the feed-forward current; wherein the feed-forward path includes a switched-capacitor ripple-smoothing filter control signal generator having: a phase detector configured to compare the phases of a reference signal and a feedback signal and generate a non-delayed up signal and a non-delayed down signal responsive to the phase comparison; and a programmable delay circuit configured to delay the non-delayed up and down signals to provide an up signal and a down signal.

BRIEF DESCRIPTION OF THE DRAWINGS

Use of the same reference symbols in different figures indicates similar or identical items.

DETAILED DESCRIPTION

The proportional path in a sample-reset loop filter having a double-sampling architecture may also be denoted as a switched-capacitor ripple-smoothing filter. As discussed previously, a double sampling architecture for the proportional path in a sample-reset loop filter reduces jitter and simplifies the reset circuitry. As implied by the "double" sampling nomenclature, this architecture involves the use of paired capacitors. Within the capacitor pair, one capacitor is alternatively reset and charged by an input voltage while the other holds its previously-sampled voltage. The hold period for one capacitor in the pair is commonly denoted as the "hold even" period whereas the holding period for the remaining capacitor is denoted as the "hold odd" period. To prevent charge feedthrough and other errors, the hold odd and hold even periods are non-overlapping. In the present invention, a unique switched-capacitor ripple-smoothing filter is provided that permits the use of a correspondingly unique set of control signals to control the timing of the hold odd and even periods and also to trigger the resets. As compared to the prior art, the generation circuitry required to produce these control signals is greatly simplified and enables faster PLL operation.

Before discussing this generation circuitry, the unique switched-capacitor ripple-smoothing filter architecture of the present invention is further discussed.

Figure 1:
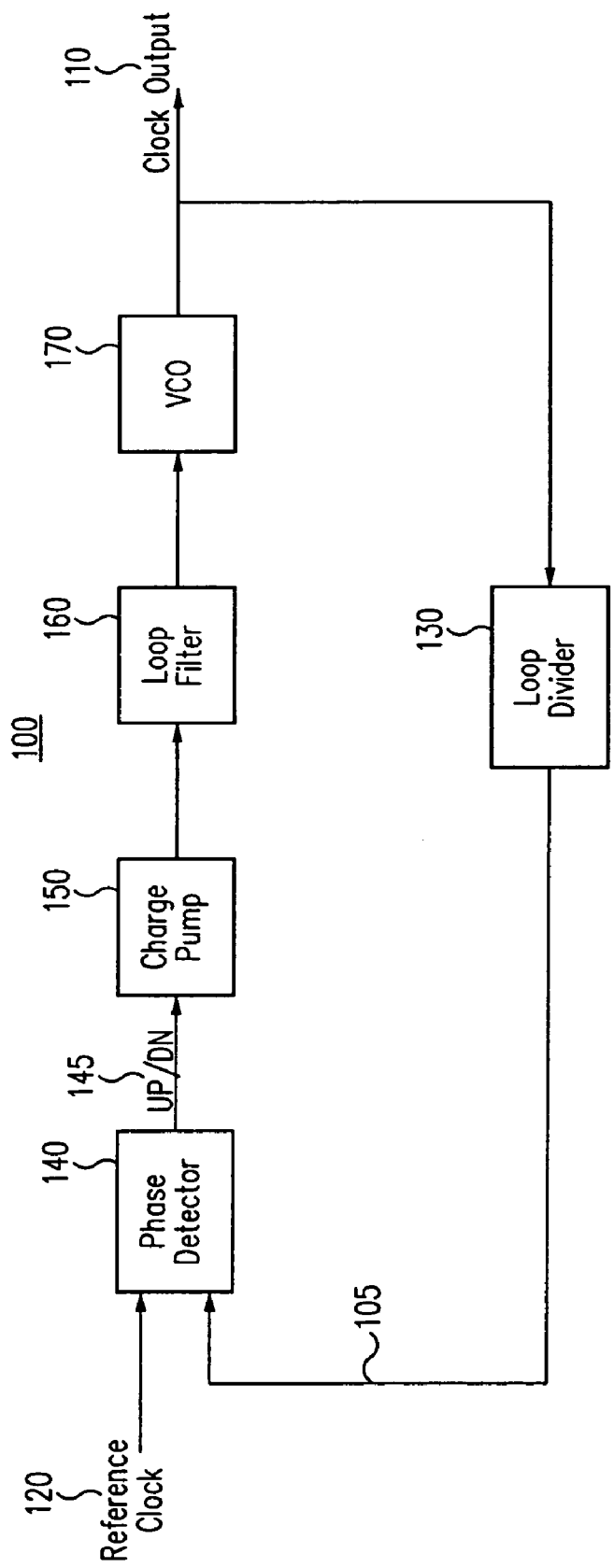
FIG. 1 is a block diagram of a conventional PLL.
Figure 2:
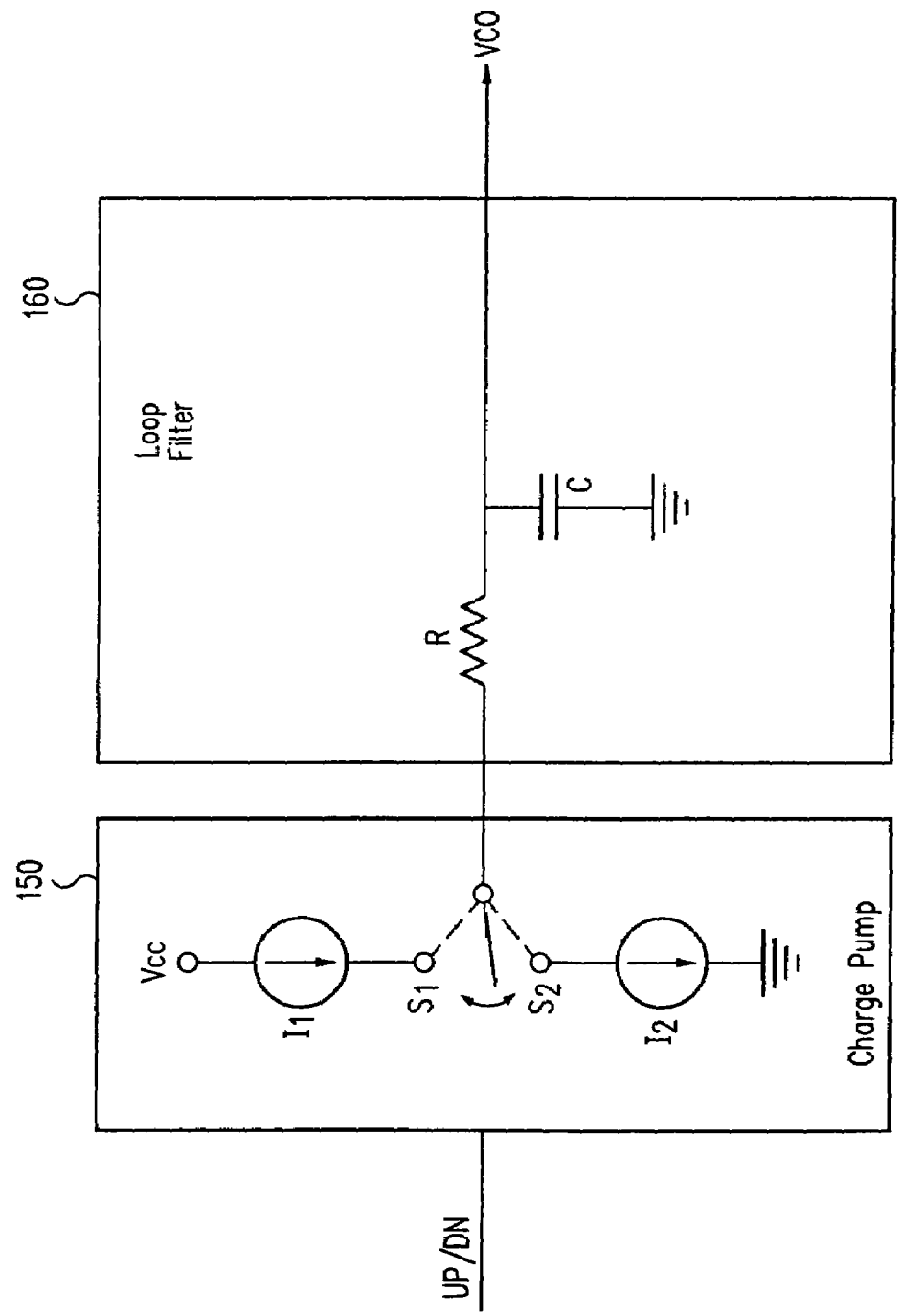
FIG. 2 is a schematic illustration of the charge pump and loop filter in the PLL of FIG. 1.
Figure 3:
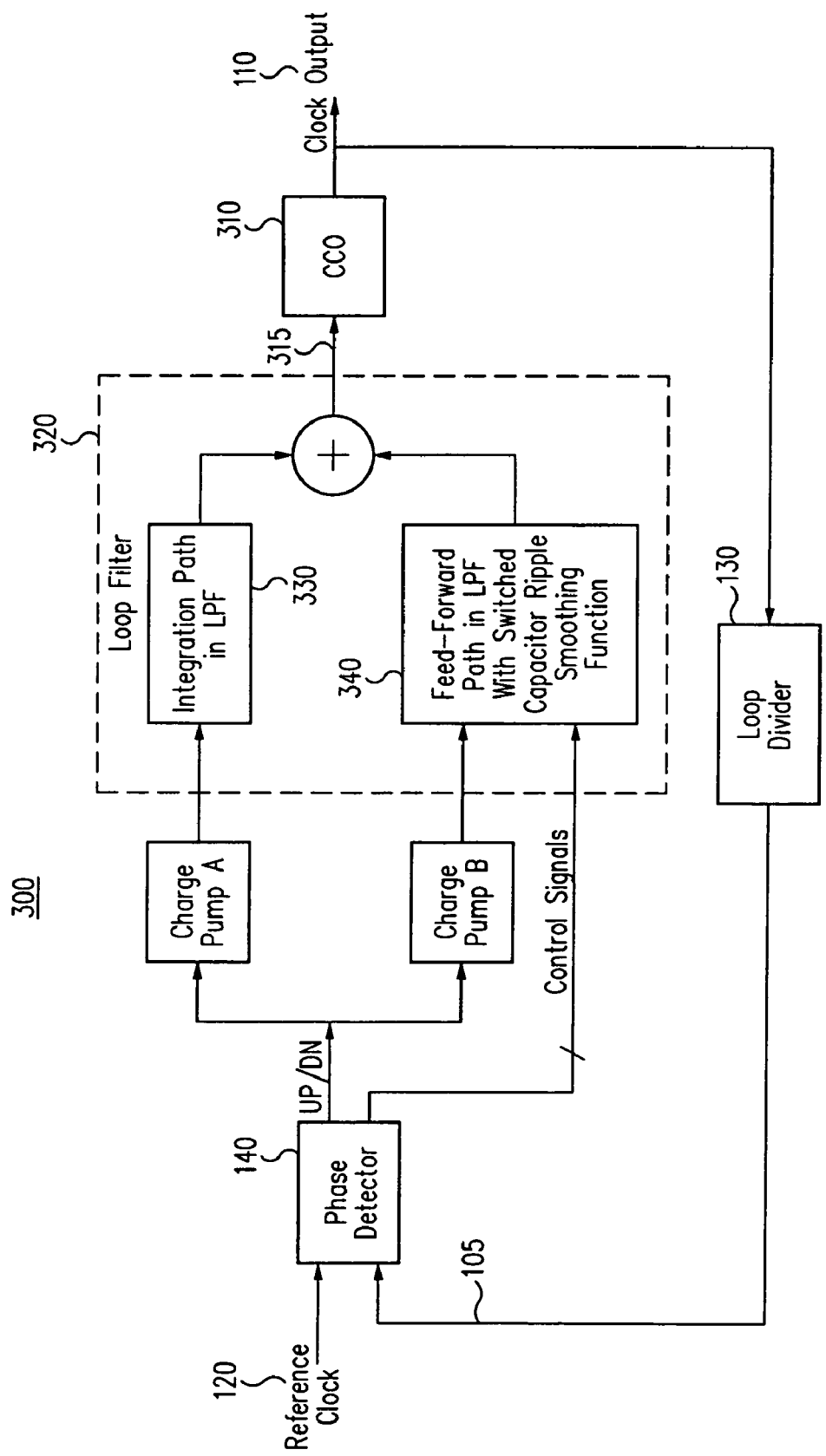
FIG. 3 is a block diagram of a set-reset loop filter.
Figure 4:
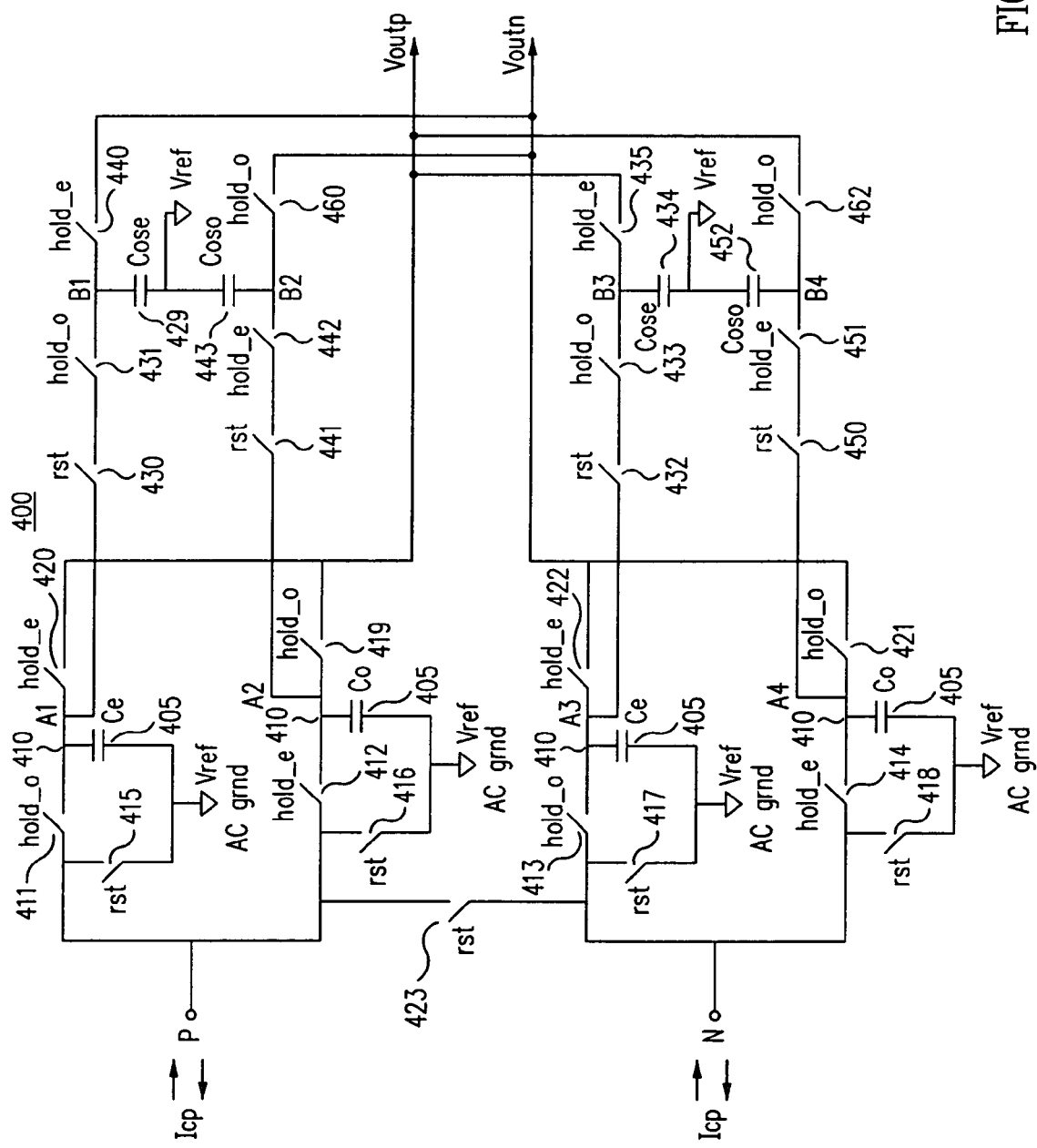
FIG. 4 is a circuit diagram of a switched-capacitor ripple-smoothing filter for the set-reset loop filter of FIG. 1 according to one embodiment of the invention.

Turning now to FIG. 4, an exemplary embodiment of a switched-capacitor ripple-smoothing filter 400 configured to use the control signals of the present invention to implement feedforward path 340 of FIG. 3 is illustrated. As discussed with respect to FIG. 2, switched-capacitor ripple-smoothing filter 400 includes a positive input node or port (denoted as input port P) and a negative input node or port (denoted as input port N). A charge pump (not illustrated) such as charge pump B of FIG. 3 charges these nodes in a complementary fashion in response to the relative pulse widths of the up and down signals as also discussed previously. Each input port is provided with a pair of capacitors denoted as an odd capacitor and an even capacitor (abbreviated as Co and Ce, respectively) to correspond to the odd and even hold periods. Depending upon the relative pulse widths of the up and down signals (shown in FIGS. 1 through 3), a current Icp either charges or is sourced from nodes P and N in a complementary fashion. For example, if the up pulse width is greater, the current Icp flows into node P and is sourced from node N. Alternatively, if the down pulse width is greater, the current Icp flows into node N and is sourced from node P. The resulting charge buildup/depletion is sampled by either the Co or Ce capacitor depending upon whether the hold even or hold odd period is being asserted.

Each Co or Ce capacitor has a first terminal 405 that couples to a reference voltage at an AC ground. An opposing second terminal 410 for each capacitor couples between a switch and its corresponding input node, P or N. At input node P, terminals 410 of capacitors Ce and Co couple through switches 411 and 412, respectively. When either switch 411 or 412 is closed, the corresponding capacitor may sample the charge being provided to or sourced by input node P. Similarly, terminals 410 of capacitors Ce and Co at input node N couple through switches 413 and 414, respectively. When either switch 413 or 414 is closed, the corresponding capacitor may sample the charge being provided to or sourced by input node N. The control signals for the hold even and hold odd periods are denoted as hold_e and hold_o, respectively. Thus, hold_e is asserted during the hold even period whereas hold_o is asserted during the hold odd period. Because the odd capacitors Co at input nodes P and N sample during the hold even period, switches 412 and 414 are shown to be under the control of hold_e. Similarly, because the even capacitors Ce at input nodes P and N sample during the odd hold period, switches 411 and 413 are shown to be under the control of hold_o.

Prior to sampling, each capacitor Ce or Co is reset responsive to the assertion of a reset control signal (denoted as rst). The rst signal controls a reset switch that couples in parallel with its respective capacitor, Ce or Co. At input node P, reset switches 415 and 416 couple in parallel with capacitors Ce and Co, respectively. At input node N, reset switches 417 and 418 couple in parallel with capacitors Ce and Co, respectively. The reset of these switches occurs after assertion of either the hold even or hold odd control signal in a non-overlapping fashion. For example, when the hold odd period is asserted, capacitors Ce may be coupled to be charged/discharged by the current flow into or out of the corresponding input node P or N. Prior to this coupling, these capacitors are reset by the closing of the reset switches 415 and 417 such that each capacitor discharges to the AC ground. However, it will be appreciated that as the sampling speed of the sample-reset loop filter incorporating filter 400 is increased to, for example, several hundred MHz, the duration of the reset period during which the appropriate reset switches are closed will not be sufficient to fully discharge capacitors Ce and Co. As will be explained further herein, filter 400 includes offset cancellation circuitry to account for this incomplete discharge.

The odd and even capacitors Co and Ce for each input node P and N will also couple to an output node when the corresponding hold signal is asserted. For example, capacitors Co and Ce at input node P couple through switches 419 and 420, respectively, to an output node denoted as Voutp. Switch 419 is controlled by hold_o whereas switch 420 is controlled by hold_e. Similarly, capacitors Co and Ce at input node N couple through switches 421 and 422 to an output node denoted as Voutn. Switch 421 is controlled by hold_o whereas switch 422 is controlled by hold_e. Because of the complementary charging of input nodes P and N, the voltages at nodes Voutp and Voutn will also vary in a complementary fashion from a common-mode voltage. The difference between these output voltages may be transformed into a current using transconductance stages (not illustrated) to form the proportional path control current component in a sample-reset loop filter as discussed with respect to FIG. 3. An additional switch 423 may couple between input nodes P and N so that they will be pulled towards the same potential during the reset period as rst is asserted.

As discussed above, the relatively high sampling rates that are desirable to enable high-speed PLL operation prohibit complete resetting of the odd and even capacitors. Filter 400 accounts for the resulting offset voltages that will be impressed across these capacitors at the end of the reset period. For example, at the end of the reset period, a node A1 at terminal 410 of capacitor Ce for input node P will be charged to the reference voltage plus an offset voltage component that may be denoted as Voffsetp. Similarly, at the end of the reset period, a node A3 at terminal 410 of capacitor Ce for input node N will be charged to the reference voltage (denoted as Vref) plus an offset voltage component that may be denoted as Voffsetn.

The need for offset cancellation may be seen with respect to the difference between Voutp and Voutn should no offset cancellation be performed. The voltages at nodes A1 and A3 will depend upon the relative pulse width difference between the up and down control voltages discussed with respect to FIGS. 1 through 3. This pulse width difference time period may be denoted as tupdn. The current provided to or sourced from the input nodes P and N may be denoted as Icp. Assuming that the up pulse width is greater than the down pulse width, current Icp flows into input node P and from input node N for the period tupdn. In response to the pulsing of the up and down signals, a total charge q=Icp*tupdn will thus flow into node P whereas this same charge will be sourced from node N. For discussion clarity, the capacitance for capacitors Ce and Co will both equal a value C. In response to this charging, the voltage at node A1 will thus equal Vref+Voffsetp+Icp*Tupdn/C whereas the voltage at node A2 will equal Vref+Voffsetn−Icp*Tupdn/C. At the subsequent hold even period, the difference between Voutp and Voutn then becomes Voffsetp−Voffsetn+2Icp*tupdn/C. The difference voltage is thus distorted by the undesirable quantity Voffsetp−Voffsetn.

From the preceding discussion, it may be seen that if during the hold even period Voffsetn is added to Voutp and Voffsetp added to Voutn, then all the offset components will cancel when the difference between Voutp and Voutn is formed. To effect this cancellation, the offset voltages are sampled during the reset period and then held. For example, node A1 will have an offset voltage of Vref+Voffsetn at the end of the reset period for capacitor Ce. This voltage will be sampled through a closure of switches 430 and 431 to charge a capacitor 429. Switch 430 is controlled by rst whereas switch 431 is controlled by hold_o. Accordingly, nodes A1 and B1 will be at the same potential when both rst and hold_o are asserted. To maintain the parallelism, capacitor Cose is also coupled to an AC ground held at Vref. Thus, at the end of the reset period, the voltage at node B1 will equal Vref+Voffsetp.

The offset voltage at node A3 is sampled in an analogous fashion. Because of the incomplete reset discussed previously, node A3 will have a potential of Vref+Voffsetn at the end of the reset period. This voltage is sampled through closure of switches 432 and 433 to charge a capacitor 434. Switch 432 is controlled by rst whereas switch 433 is controlled by hold_o. Thus, at the end of the reset for the Ce capacitors, nodes A3 and B3 will have the same potential. At the subsequent hold even period, the capacitor Ce for input node P and capacitor 434 are coupled in parallel through closure of switch 420 and a switch 435, both switches being responsive to hold_e. Thus, if capacitor Ce and capacitor 429 have the same capacitance C, Voutp becomes equal to the quantity (Vref+Voffsetp/2+Voffsetn/2+Icp*tupdn/2C). Similarly, during this hold even period, the capacitor Ce at input node N and capacitor 429 are coupled in parallel through closure of switch 422 and a switch 440, both switches also being controlled by hold_e. If capacitor Ce and capacitor 429 also have the same capacitance C, Voutn becomes equal to the quantity (Vref+Voffsetp/2+Voffsetn/2−Icp*tupdn/2C). The difference between Voutp and Voutn thus becomes Icp*tupdn/C such that all the offset voltage components are cancelled.

An analogous offset cancellation occurs with respect to the Co capacitors. For example, the voltage at node A2 is sampled through switches 441 and 442 to charge a capacitor 443. Similarly, the voltage at node A4 is sampled through switches 450 and 451 to charge a capacitor 452. At the subsequent hold odd period, a switch 460 and a switch 462 both are closed to provide the offset cancellation. Advantageously, this offset cancellation occurs with no latency. In other words, for a given hold period, the corresponding offset voltages are cancelled as the output voltages are provided. In contrast, conventional latency offset cancellation stage require additional hold periods to cancel the offset voltages, thereby aggravating jitter and other problems. In contrast, the present invention provides an offset cancellation without latency to reduce jitter. Those of ordinary skill will appreciate that the various switches shown in filter 400 may be implemented using transistor switches such as a MOSFET or a bipolar transistor switch.

Figure 5:
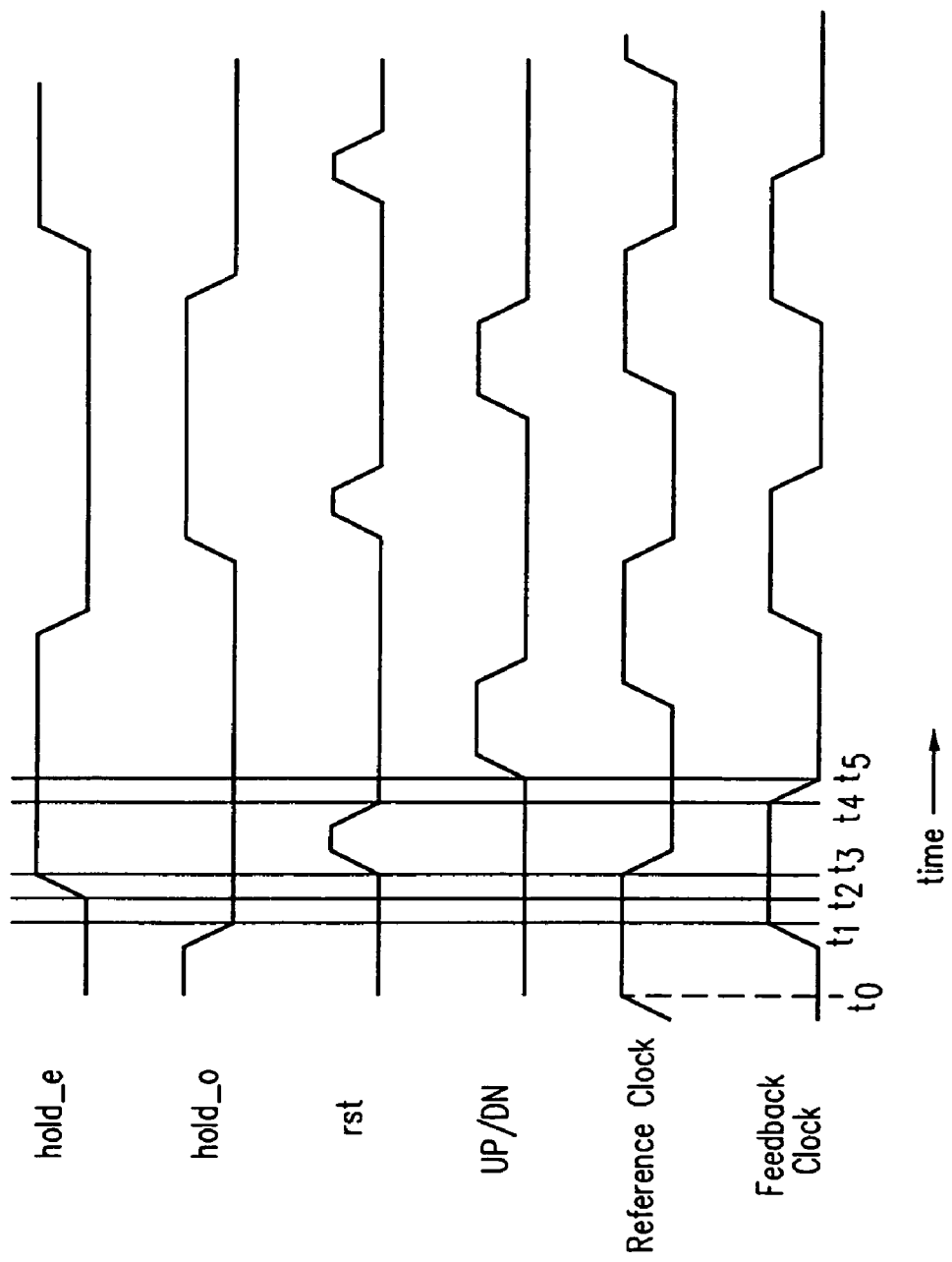
FIG. 5 is a timing diagram for the control signals for the switched-capacitor ripple-smoothing filter of FIG. 4.

As discussed above, the hold even and hold odd periods should be non-overlapped to prevent charge feedthrough and other undesirable effects. In addition, the reset and sampling periods should also be non-overlapped. As known in the sample-reset loop filter art, the control signals for effecting the timing of these periods will be generated in response to the up and down signal timing. This may be seen in FIG. 3, wherein phase detector 140 not only generates the up and down pulses but also the control signals for feedforward path 340. A timing diagram for the control signals hold_o, hold_e, and rst is shown in FIG. 5. The UP/DN signal is being used generically to represent either the up or down pulse, which ever exceeds the other.

Figure 6:
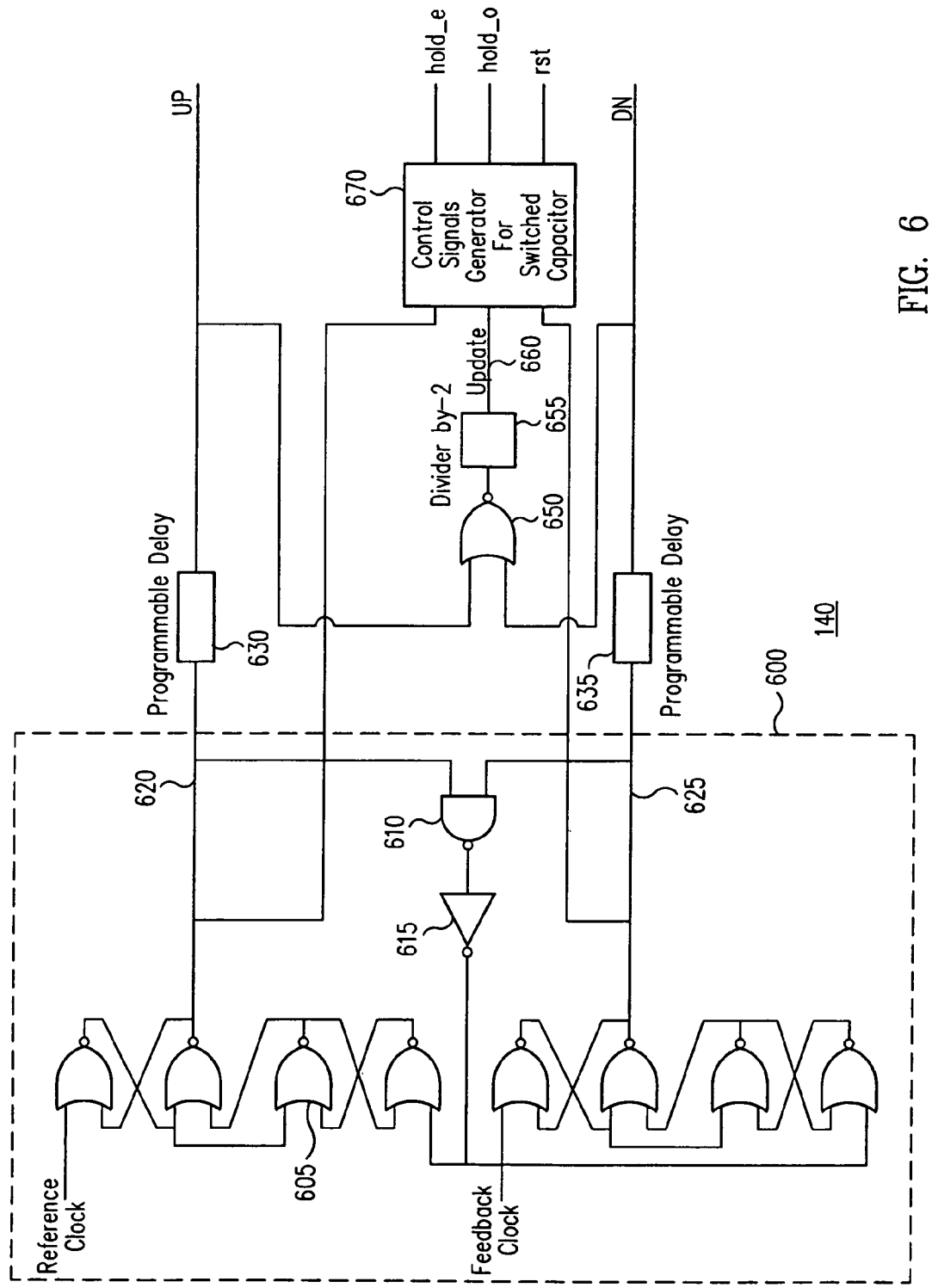
FIG. 6 is a block diagram for the phase detector and control signal generator for the set-reset loop filter of FIG. 3 according to one embodiment of the invention.

The control signals must be synchronized to the UP/DN pulse for proper operation of ripple-smoothing filter 400. In other words, prior to the pulsing of the UP/DN signal, one of the hold odd or hold even (hold_o or hold_e) control signals should already have been asserted. After the assertion of this hold signal, the reset period must be completed (assertion of rst) so that the appropriate capacitors (Ce or Co) may be reset prior to the sampling period for the UP/DN signal. In turn, the generation of the UP/DN signal is responsive to the phase relationship of the reference clock and the feedback clock. Referring now to FIG. 6, a phase detector and control signal sequence generator 140 is illustrated. Phase detector 140 includes a conventional phase detector stage 600 using cross-coupled NOR gates 605, NAND gate 610, and inverter 615 to generate a non-delayed up 620 and a non-delayed down signal 625. These non-delayed up and down signals 620 and 625 would be appropriate for use in a conventional loop filter that does not implement a proportional path requiring a double-sampling architecture. However, as discussed above with respect to FIG. 5, a double-sampling architecture requires that the appropriate hold period (hold even or hold odd) be established and the reset occur before the pulsing of the up and down signals. Thus signals 620 and 625 are delayed in programmable delay units 630 and 635, respectively, to produce the up and down signals. For example, should the UP/DN signal of FIG. 5 represent the UP signal, it may be seen from FIG. 5 that a non-delayed up signal could have been asserted starting at time $t_0$. However, programmable delay unit 630 delays the onset of the up signal until time $t_5$. This delay allows the following events to occur. For example, prior to the pulsing of the UP/DN signal, the hold signal for the capacitor set (Ce or Co) that will be reset and sampled must be de-asserted. In FIG. 5, the timing is such that it is the Co capacitor set that will be so reset and charged. Thus, at time $t_1$, the hold_o control signal is de-asserted. After an appropriate delay to ensure the non-overlapped timing, the hold_e control signal may be asserted at time $t_2$. After a further delay to again ensure the non-overlapped timing, rst may be asserted at time $t_3$. The duration of the reset period should be sufficient to ensure adequate resetting of the capacitors Ce and Co and will depend upon the switching speed, capacitance, semiconductor processing speed, and other design considerations. After the reset period ends at time $t_4$, the UP/DN signal may be asserted at time $t_5$ after an appropriate delay to again ensure non-overlapped timing.

Figure 7:
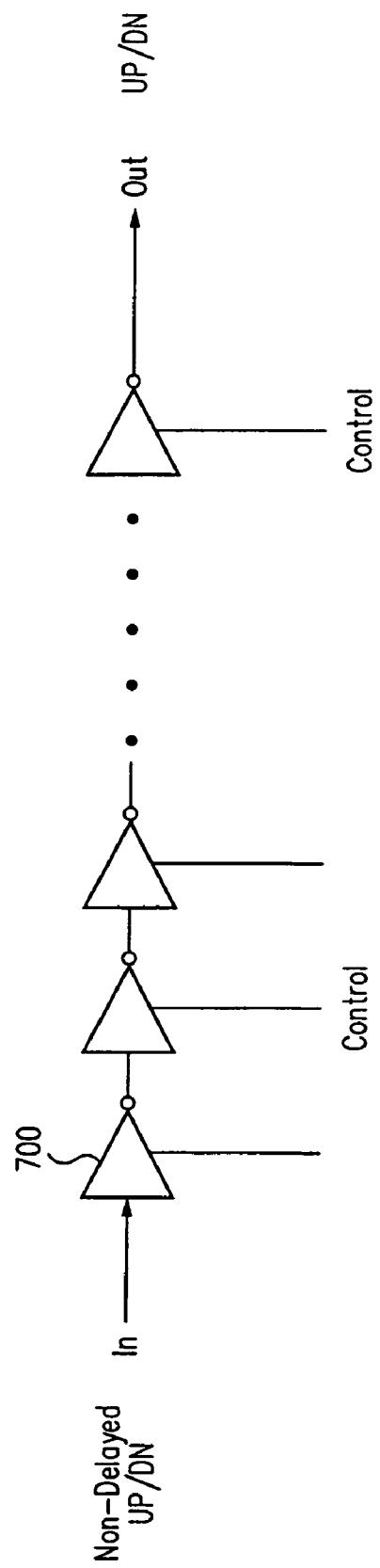
FIG. 7 is a block diagram of a programmable delay unit in FIG. 6.

The delay from $t_0$ to $t_5$ is provided by the programmable delay units 630 and 635 as just described. To provide this delay, a number of programmable delay units may be used such as programmable inverters 700 as shown in FIG. 7. The delay from the in port to the out port depends upon whether a given inverter is asserted by its control signal. If an inverter 700 is asserted, it adds a unit of delay into the propagation path between the in and out ports. If an inverter 700 is not asserted, it merely acts as a pass through for the signal and does add significantly to the overall delay. The control signals for controlling inverters 700 may be stored in either a volatile or non-volatile memory (not illustrated).

In this fashion, the up and down signals from programmable delay units 630 and 635 may be appropriately delayed with respect to non-delayed up and down signals 620 and 625. This delay should be sufficient so that the reset period may have an adequate duration as discussed above. Too much delay, however, will slow operation speed. Thus, a circuit simulation may be performed using standard integrated circuit development tools to simulate operation of switched-capacitor ripple-smoothing filter 400 to determine the optimal delay period. The programmable delay units 630 and 635 may then be set accordingly. To produce the odd/even timing to alternate the up and down signals, a NOR gate 650 receives the up and down signals and provides an output to a divider-by-2 circuit 655. Divider 655 then provides an update signal 660 that will be asserted between falling edges of the UP/DN signal (which is either the up or down signal depending upon which has the greatest pulse width). Those of ordinary skill will appreciate that buffer stages (not illustrated) may be inserted into the up and down signal generation paths as necessary to ensure adequate input driving of components.

Figure 8:
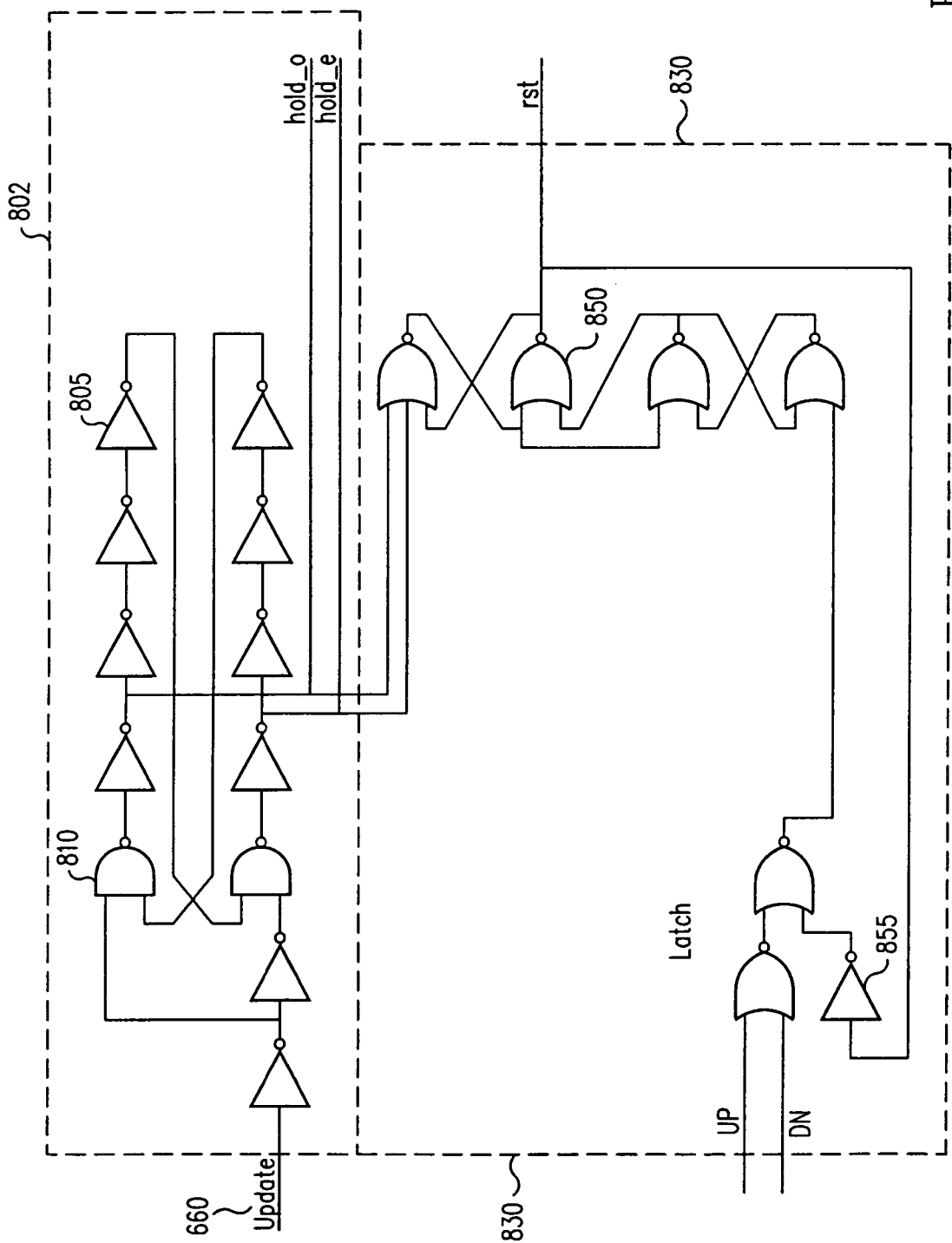
FIG. 8 is a circuit diagram of the control signal generator in FIG. 6.

A control signal generator 670 responds to the assertion of the update signal to produce the hold_e, hold_o, and rst signals. Turning now to FIG. 8, a circuit diagram for control signal generator 670 is shown. Control signal generator 670 includes a conventional non-overlapped clock generator circuit 802 implemented with inverters 805 and NAND gates 810. Non-overlapped clock generator circuit 802 responds to update signal 660 to produce control signals hold_e and hold_o in a non-overlapped fashion. It will be appreciated that other architectures exist for non-overlapped signal generators and such architectures may be used as well to implement circuit 802. A latch 830 responds to the assertion of either hold_e or hold_o by asserting rst. Latch 830 "resets" reset signal rst by de-asserting rst responsive to the assertion of either non-delayed up 620 or non-delayed down 625. Latch 830 is implemented using NOR gates 850 and an inverter 855. It will be appreciated, however, that other latch or flip-flop architectures may be used to implement latch 830.

The control signals hold_e, hold_o, and rst control switches in filter 400 as discussed with respect to FIG. 4. Should these switches be implemented as a MOSFET switch using CMOS technology, each control signal should comprise a true and a complement version. However, as used herein, a control signal which may comprise a true and a complement version is denoted as a "single" control signal because the true and complement version are entirely synchronous with respect to their clock edges. Should a control signal comprise a true and a complement version, inverters may be used to produce the complement signals. Note also that the up and down signals have been shown as single-ended signals for illustration clarity. Those of ordinary skill will appreciate that phase detector 140 may easily be modified to produce differential versions of the up and down signals.

Regardless of whether the up and down signals are single-ended or differential, the present invention provides a switched-capacitor ripple-smoothing filter that requires only three control signals (hold_e, hold_o, and rst) in addition to the up and down signals. Not only are fewer control signals needed as compared to prior art filters, but the generation circuitry needed to provide the control signals is greatly simplified as well. Moreover, because of the programmable delay stages used in the generation circuitry, the delaying of the up and down signals may be minimized to ensure that reset signal and the up and down signals are non-overlapped to the minimum extent necessary. The required delay may be calculated using simulation software and will depend upon component values, switching speed, semiconductor process speed, and other variables.

The above-described embodiments of the present invention are merely meant to be illustrative and not limiting. It will thus be obvious to those skilled in the art that various changes and modifications may be made without departing from this invention in its broader aspects. Accordingly, the appended claims encompass all such changes and modifications as fall within the true spirit and scope of this invention.

The invention claimed is:

1. A sample-reset loop filter, comprising:
    a control signal generator including:
        a phase detector configured to compare the phases of a reference signal and a feedback signal and to generate an up signal and a down signal responsive to the phase comparison;
        a programmable delay circuit configurable to delay the up and the down signals;
        a divider circuit configured to respond to the up and down signals to provide a divided clock signal; and
        a clock generator configured to respond to the divided clock signal to provide hold even and hold odd signals;
    a first charge pump configured to charge a first pair of input nodes in a complementary fashion responsive to the pulse widths of the up signal and the down signal;
    a second charge pump configured to charge a second pair of input nodes in a complementary fashion responsive to the pulse widths of the up and down signals;
    a loop filter having an integration path configured to filter the potentials of the first pair of input nodes to provide an integration current and having a feed-forward path configured to filter the potential of the second pair of input nodes to provide a feed-forward current; and
    a current-controlled oscillator configured to adjust the frequency of an output signal responsive to the summation of the integration current and the feed-forward current;
        wherein the feed-forward path includes a switched-capacitor ripple-smoothing filter.

2. The sample-reset loop filter of claim 1, wherein the clock generator comprises a non-overlapped clock generator configured to respond to the divided clock signal to provide non-overlapped hold even and hold odd signals.

3. The sample-reset loop filter of claim 1, wherein the divider circuit is a divider-by-2 circuit.

4. The sample-reset loop filter of claim 1, further including a loop divider configured to divide the output signal to provide the feedback signal for the phase detector.

5. A sample-reset loop filter, comprising:
    a control signal generator including:
        a phase detector configured to compare the phases of a reference signal and a feedback signal and to generate an up signal and a down signal responsive to the phase comparison;
        a divider circuit configured to respond to the up and down signals to provide a divided clock signal; and
        a clock generator configured to respond to the divided clock signal to provide hold even and hold odd signals;
    a first charge pump configured to charge a first pair of input nodes in a complementary fashion responsive to the pulse widths of the up signal and the down signal;
    a second charge pump configured to charge a second pair of input nodes in a complementary fashion responsive to the pulse widths of the up and down signals;
    a loop filter having an integration path configured to filter the potentials of the first pair of input nodes to provide an integration current and having a feed-forward path configured to filter the potential of the second pair of input nodes to provide a feed-forward current; and
    a current-controlled oscillator configured to adjust the frequency of an output signals responsive to the summation of the integration current and the feed-forward current;
    wherein the feed-forward path comprises a switched-capacitor ripple-smoothing filter configured to reset its capacitors in response to a reset signal.

6. The sample-reset loop filter of claim 5, wherein the second pair of input nodes includes first and second input nodes of the switched-capacitor ripple smoothing filter, the switched-capacitor ripple-smoothing filter further including:
    a first pair of capacitors, the switched-capacitor ripple-smoothing filter being configured such that either capacitor in the first pair is capable of being reset and have a terminal coupled to the first input node for charging and such that the remaining capacitor in the first pair is isolated from the first input node and has its terminal coupled to a first output node while the other capacitor is being charged; and
    a second pair of capacitors, the switched capacitor ripple-smoothing filter being configured such that either capacitor in the second pair is capable of being reset and have a terminal coupled to the second input node for charging and such that the remaining capacitor in the second pair is isolated from the second input node and has its terminal coupled to a second output node while the other capacitor in the second pair is being charged,
    wherein the feed-forward current is formed responsive to a difference between the potentials of the first and second output nodes.

7. The sample-reset loop filter of claim 5, wherein the switched-capacitor ripple-smoothing filter is configured to cancel offset voltages remaining on its capacitors after being reset.

8. The sample-reset loop filter of claim 5, further comprising a loop divider configured to divide the output signal to provide the feedback signal for the phase detector.

9. The sample-reset loop filter of claim 5, wherein the control signal generator further includes a programmable delay circuit configurable to delay the up and the down signals.

* * * * *